United States Patent
Okazaki et al.

[11] Patent Number: 5,948,281
[45] Date of Patent: Sep. 7, 1999

[54] MICROLENS ARRAY AND METHOD OF FORMING SAME AND SOLID-STATE IMAGE PICKUP DEVICE AND METHOD OF MANUFACTURING SAME

[75] Inventors: Yuichi Okazaki; Yoshinori Tomiya, both of Kanagawa, Japan

[73] Assignee: Sony Corporation, Tokyo, Japan

[21] Appl. No.: 08/921,629

[22] Filed: Aug. 27, 1997

[30] Foreign Application Priority Data

Aug. 30, 1996 [JP] Japan .................................. 8-249244
Sep. 20, 1996 [JP] Japan .................................. 8-271798

[51] Int. Cl.[6] .................................................. B29D 11/00
[52] U.S. Cl. ............................................. 216/26; 216/24
[58] Field of Search ........................ 216/26, 24; 430/321

[56] References Cited

U.S. PATENT DOCUMENTS 5,300,263  4/1994  Hoopman ................................. 264/2.5
5,370,768  12/1994  Mersereau ............................... 156/643

Primary Examiner—R. Bruce Breneman
Assistant Examiner—Shamim Ahmed
Attorney, Agent, or Firm—Hill & Simpson

[57] ABSTRACT

A resist having a three-dimensional shape of a microlens array and a material layer of the microlens array are simultaneously etched under a condition by which planar patterns transferred from the resist to the material layer are larger than planar patterns of the resist. The spacing between microlenses can be made narrower than the spacing between the planar patterns of the resist. Even when the planar shape of the microlens is an ellipse, the curvatures can be optimized in both the row and column directions by making the heights in these directions different from each other. It is possible to provide a microlens array having a small non-focusing region and a solid-state image pickup device having a high sensitivity and little smear.

19 Claims, 7 Drawing Sheets

MICROLENS ARRAY AND METHOD OF FORMING SAME AND SOLID-STATE IMAGE PICKUP DEVICE AND METHOD OF MANUFACTURING SAME

BACKGROUND OF THE INVENTION

1. Field of the Invention

The present invention relates to a microlens array in which a plurality of microlenses are arranged, a method of forming the microlens array, a solid-state image pickup device having the microlens array, and a method of manufacturing the solid-state image pickup device.

2. Description of the Related Art

To realize, for example, a solid-state image pickup device which forms fine images and is small in size and light in weight, it is necessary to decrease the area of each pixel. As a consequence, however, the incident light quantity per pixel decreases, and this lowers the sensitivity. Therefore, a microlens array having microlenses in a one-to-one correspondence with a plurality of photosensitive portions is provided in an on-chip state. Each microlens focuses, toward a photosensitive portion, even light incident on a portion except the photosensitive portion.

FIGS. 1A to 2 show the first related art of a CCD solid-state image pickup device having this microlens array and a method of manufacturing this CCD solid-state image pickup device. In the manufacturing method of this first related art, as shown in FIG. 1A, photosensitive portions 12 are formed in a semiconductor substrate 11, and conductive films 13 used to isolate pixels and as charge transfer electrodes are formed on the semiconductor substrate 11. The conductive films 13 and the like are covered with light-shielding films 14, and the light-shielding films 14 are covered with a planarizing film 15. In addition, a color filter 16 is formed on the planarizing film 15.

Thereafter, a material layer 17 of a microlens array is formed on the color filter 16 by using, e.g., a polystyrene resin or a polyimide resin. The surface of the material layer 17 is coated with a resist 21, and the resist 21 is processed into planar patterns of the microlens array. As shown in FIG. 1B, the resist 21 is formed into a three-dimensional shape of the microlens array by reflow.

In FIG. 1C, the resist 21 and the material layer 17 are simultaneously etched to transfer the three-dimensional shape of the resist 21 to the material layer 17. Consequently, as shown in FIG. 2, a microlens array 23 having microlenses 22 in a one-to-one correspondence with the photosensitive portions 12 is formed.

Note that when the resist 21 and the material layer 17 are simultaneously etched, the material layer 17 is formerly side-etched to produce a negative critical dimension or CD loss by which the planar patterns transferred from the resist 21 to the material layer 17 are smaller than the planar patterns of the resist 21. Recently, however, the planar patterns of the resist 21 are accurately transferred to t he material layer 17.

When the resist 21 is processed in the step shown in FIG. 1A, a spacing x of about 0.4 m is formed between the planar patterns of the resist 21 due to the limit of the resolution of lithography. This spacing x can be narrowed by reflow in the step shown in FIG. 1B. However, if the planar patterns of the resist 21 are made too close to each other, the planar patterns of the resist 21 can contact each other due to, e.g., a variation in reflow.

If the planar patterns of the resist 21 contact each other, the resist 21 is planarized by, e.g., the surface tension of the resist 21, and this makes the formation of the microlens array 23 impossible. Therefore, even after reflow, the spacing between the planar patterns of the resist 21 can be narrowed to at most about 0.3 $\mu$m.

FIGS. 3A and 3B show vertical and horizontal sections of the second related art of a solid-state image pickup device having a microlens array. In this second related art, photosensitive portions 32 are formed in a semiconductor substrate 31, and conductive films 33 to be used to isolate pixels and as charge transfer electrodes are formed on the semiconductor substrate 31. The conductive films 33 and the like are covered with light-shielding films 34, and the light-shielding films 34 and the like are covered with a planarizing film 35.

A color filer 36 is formed on the planarizing film 35, and microlenses 37 are formed on this color filter 36. The photosensitive portions 32 are arranged in a matrix manner, and the microlenses 37 are formed in a one-to-one correspondence with these photosensitive portions 32. As shown in FIG. 4, the microlenses 37 are also arranged in a matrix manner to form a microlens array 38.

In the first related art shown in FIGS. 1A to 2, the planar patterns of the resist 21 are accurately transferred to the material layer 17. Therefore, as shown in FIG. 2, the spacing between the microlenses 22 is also as wide as about 0.3 $\mu$m, so only the microlens array 23 having a large non-focusing region can be formed.

In the microlens array 23 having this large non-focusing region, however, as can be seen from FIG. 2, incident light 24 is not effectively focused on the photosensitive portions 12. Additionally, a large quantity of the incident light 24 is obliquely incident on the photosensitive portions 12 by being reflected by the light-shielding films 14 or the like and enters into portions below the charge transfer electrodes. Accordingly, in this first related art it is difficult to accomplish a solid-state image pickup device with a high sensitivity and little smear.

The pattern of each pixel of a solid-state image pickup device is generally a rectangle rather than a square. Therefore, as shown in FIG. 4, the planar shape of the microlens 37 is also an ellipse or a shape close to an ellipse, rather than a true circle. Nevertheless, in the second related art described above, the microlens 37 has equal heights y in both the vertical and horizontal directions regardless of whether the diameter of the microlens 37 is small as shown in FIG. 3A or large as shown in FIG. 3B.

Accordingly, the curvature of the microlens 37 in the vertical direction differs from that in the horizontal direction. When the focal point of incident light 39 is positioned in the photosensitive portion 32 in the horizontal direction, the focal point of the incident light 39 is not positioned in the photosensitive portion 32 in the vertical direction. Consequently, in the above second related art, the sensitivity is not necessarily sufficiently high although the microlenses 37 are used, and it is difficult to reduce smear or the like. This phenomenon becomes typical as the aspect ratio of the pattern of each pixel increases.

Note that it is being attempted to adjust curvatures by making lens heights in the vertical and horizontal directions substantially different from each other by forming a cylindrical lens continuously extending in the vertical or horizontal direction and further forming separate lenses across this cylindrical lens in a one-to-one correspondence with pixels.

Unfortunately, it is presently very difficult to form two types of lenses overlapped as above. Also, when such two types of lenses are formed, the number of manufacturing steps increases to lower the productivity, and this increases the manufacturing cost of a solid-state image pickup device. Additionally, even when such two types of lenses are used, interfaces exist inside the lenses so incident light is reflected more. Accordingly, it is still difficult to increase the sensitivity and reduce smear or the like.

OBJECT AND SUMMARY OF THE INVENTION

It is, therefore, an object of the present invention to provide a microlens array in which the spacing between microlenses is narrow and a non-focusing region is small, and a solid-state image pickup device having a high sensitivity and little smear.

According to one aspect of the invention, in a microlens array, the heights of a microlens in the row and column directions are different from each other and are made from a single material layer. For this reason, the curvatures can be optimized in both the row and column directions by adjusting these heights. Consequently, even when the planar shape of the microlens is not a true circle, the focal points of incident light in the row and column directions can be positioned in a single point. Additionally, since the microlens is made from a single material layer, no interface exists inside the microlens, so incident light is reflected little. Accordingly, it is possible to realize a solid-state image pickup device with a high sensitivity and little smear, a liquid crystal display device which displays clear images or the like.

According to another aspect of the invention, in a microlens array, the planar shape of a microlens is an ellipse. For this reason, incident light can be effectively focused by opposing the microlens to a wide portion of even a region having different lengths in the row and column directions. Accordingly, although the degree of freedom of the pattern of each pixel is high, it is possible to realize a solid-state image pickup device with a high sensitivity and little smear, a liquid crystal display device which displays clear images or the like.

According to another aspect of the invention, a microlens array opposes a plurality of photosensitive portions of a solid-state image pickup device. For this reason, external incident light can be effectively focused on these photosensitive portions even when the pattern of each pixel of the solid-state image pickup device is a rectangle. Accordingly, a solid-state image pickup device with a high sensitivity and little smear can be realized although the degree of freedom of the pattern of each pixel is high.

According to another aspect of the invention, a microlens array opposes a plurality of display portions of a liquid crystal display device. For this reason, incident light from these display portions can be effectively focused even when the pattern of each pixel of the liquid crystal display device is a rectangle. Accordingly, a liquid crystal display device which displays clear images can be realized although the degree of freedom of the pattern of each pixel is high.

In a method of forming a microlens array according to an aspect of the invention, a mask layer and a material layer of a microlens array are simultaneously etched under a condition by which planar patterns transferred from the mask layer to the material layer are larger than planar patterns of the mask layer. For this reason, a microlens array with a small non-focusing region can be formed by making the spacing between microlenses narrower than the spacing between the planar patterns of the mask layer. Accordingly, it is possible to realize a solid-state image pickup device with a high sensitivity and little smear, a liquid crystal display device which displays clear images or the like.

In a method of forming a microlens array according to another aspect of the invention, after microlenses start contacting each other in a direction in which the spacing between dome-like portions of a mask layer is narrow, the height of the microlenses in this direction becomes substantially smaller than the height in a direction perpendicular to that direction. Therefore, the curvatures can be optimized in both the row and column directions by adjusting the heights of the microlenses by adjusting the spacings between the dome-like portions of the mask layer.

As a consequence, it is possible to form a microlens by which the focal points of incident light in the row and column directions are positioned in a single point, even when the planar shape of the microlens is not a true circle. Additionally, since the material layer of the microlenses can be a single layer, a microlens which has no interface inside it and rarely reflects incident light can be formed. Accordingly, it is possible to realize a solid-state image pickup device with a high sensitivity and little smear, a liquid crystal display device which displays clear images or the like.

In a method of forming a microlens array according to another aspect of the invention, etching is performed by using a resist as a mask layer, a gas mixture of oxygen and $CF_4$ or $CF_4$ as an etching gas, and a magnetron RIE system. For this reason, it is possible to produce a positive critical dimension by which planar patterns transferred from the resist as a mask layer to a material layer of a microlens array are larger than planar patterns of the resist. Additionally, the amount of this positive critical dimension can be controlled by properly selecting the volume mixing ratio of oxygen to $CF_4$ as an etching gas. Accordingly, it is readily possible to accomplish a solid-state image pickup device with a high sensitivity and little smear, a liquid crystal display device which displays clear images or the like.

In a method of forming a microlens array according to another aspect of the invention, the flow rate of an etching gas is set at 10 to 100 ccm. This produces a positive critical dimension by which planar patterns transferred from a resist as a mask layer to a material layer of a microlens array are larger than planar patterns of the resist. Accordingly, it is possible to accomplish a solid-state image pickup device with a high sensitivity and little smear, a liquid crystal display device which displays clear images or the like.

In a method of forming a microlens array according to another aspect of the invention, the volume mixing ratio of oxygen to $CF_4$ in a gas mixture as an etching gas is set at 1:1 to 10. This produces a positive critical dimension by which planar patterns transferred from a resist as a mask layer to a material layer of a microlens array are larger than planar patterns of the resist. Accordingly, it is possible to accomplish a solid-state image pickup device with a high sensitivity and little smear, a liquid crystal display device which displays clear images or the like.

In a method of forming a microlens array according to another aspect of the invention, a radio frequency power generated by a magnetron RIE system is set at 1.0 to 8.0 $W/cm^2$. This produces a positive critical dimension by which planar patterns transferred from a resist as a mask layer to a material layer of a microlens array are larger than planar patterns of the resist. Accordingly, it is possible to realize a solid-state image pickup device with a high sensitivity and little smear, a liquid crystal display device which displays clear images or the like.

In a method of forming a microlens array according to another aspect of the invention, the internal pressure of an etching chamber in a magnetron RIE system is set at 1.3 to 13.3 Pa. This produces a positive critical dimension by which planar patterns transferred from a resist as a mask layer to a material layer of a microlens array are larger than planar patterns of the resist. Accordingly, it is possible to realize a solid-state image pickup device with a high sensitivity and little smear, a liquid crystal display device which displays clear images or the like.

In a method of forming a microlens array according to another aspect of the invention, the planar shape of a mask layer is an ellipse. For this reason, it is possible to form a microlens array in which incident light can be effectively focused by opposing a microlens to a wide portion of even a region having different lengths in the row and column directions. Accordingly, although the degree of freedom of the pattern of each pixel is high, it is possible to realize a solid-state image pickup device with a high sensitivity and little smear, a liquid crystal display device which displays clear images or the like.

In a method of forming a microlens array according to another aspect of the invention, a microlens array is so formed as to oppose a plurality of photosensitive portions of a solid-state image pickup device. For this reason, it is possible to form a microlens array in which external incident light can be effectively focused on these photosensitive portions even when the pattern of each pixel of the solid-state image pickup device is a rectangle. Accordingly, a solid-state image pickup device with a high sensitivity and little smear can be realized although the degree of freedom of the pattern of each pixel is high.

In a method of forming a microlens array according to another aspect of the invention, a microlens array is so formed as to oppose a plurality of display portions of a liquid crystal display device. For this reason, it is possible to form a microlens array in which incident light from these display portions can be effectively focused even when the pattern of each pixel of the liquid crystal display device is a rectangle. Accordingly, a liquid crystal display device which displays clear images can be realized although the degree of freedom of the pattern of each pixel is high.

In a solid-state image pickup device according to another aspect of the invention, the heights of a microlens in the row and column directions are different from each other. For this reason, the curvatures can be optimized in both the row and column directions by adjusting these heights. Consequently, even when the planar shape of the microlens is not a true circle, the focal points of incident light in the row and column directions can be positioned in a photosensitive portion. Additionally, since the microlens is made from a single material layer, no interface exists inside the microlens, so incident light is rarely reflected. Accordingly, the sensitivity is high and smear is little.

In a solid-state image pickup device according to another aspect of the invention, the planar shape of a microlens is an ellipse. For this reason, incident light can be effectively focused by opposing the microlens to a wide portion of even a pixel having different lengths in the row and column directions. Accordingly, the sensitivity is high and smear is little although the degree of freedom of the pattern of each pixel is high.

In a method of manufacturing a solid-state image pickup device according to another aspect of the invention, a mask layer and a material layer of a microlens array are simultaneously etched under a condition by which planar patterns transferred from the mask layer to the material layer are larger than planar patterns of the mask layer. For this reason, a microlens array with a small non-focusing region can be formed by making the spacing between microlenses narrower than the spacing between the planar patterns of the mask layer. Accordingly, a solid-state image pickup device with a high sensitivity and little smear can be manufactured.

In a method of manufacturing a solid-state image pickup device according to another aspect of the invention, after microlenses start contacting each other in a direction in which the s pacing between dome-like portions of a mask layer is narrow, the height of the microlenses in this direction becomes substantially smaller than the height in a direction perpendicular to that direction. Therefore, the curvatures can be optimized in both the row and column directions by adjusting the heights of the microlenses by adjusting the spacings between the dome-like portions of the mask layer.

As a consequence, it is possible to form a condenser microlens by which the focal points of incident light in the row and column directions are positioned in a photosensitive portion, even when the planar shape of the microlens is not a true circle. Additionally, since the material layer of the microlenses can be a single layer, a microlens which has no interface inside it and rarely reflects incident light can be formed. Accordingly, a solid-state image pickup device with a high sensitivity and little smear can be manufactured.

In a method of manufacturing a solid-state image pickup device according to another aspect of the invention, the planar shape of a mask layer is an ellipse. For this reason, it is possible to form a microlens array by which incident light can be effectively focused by opposing the microlens to a wide portion of even a pixel having different lengths in the row and column directions. Accordingly, a solid-state image pickup device with a high sensitivity and little smear can be manufactured although the degree of freedom of the pattern of each pixel is high.

In a method of manufacturing a solid-state image pickup device according to another aspect of the invention, etching is performed by using a resist as a mask layer, a gas mixture of oxygen and $CF_4$ or $CF_4$ as an etching gas, and a magnetron RIE system. For this reason, it is possible to produce a positive critical dimension by which planar patterns transferred from the resist as a mask layer to a material layer of a microlens array are larger than planar patterns of the resist. Additionally, the amount of this positive critical dimension can be controlled by properly selecting the volume mixing ratio of oxygen to $CF_4$ as an etching gas. Accordingly, a solid-state image pickup device with a high sensitivity and little smear can be easily manufactured.

In a method of manufacturing a solid-state image pickup device according to another aspect of the invention, the flow rate of an etching gas is set at 10 to 100 ccm. This produces a positive critical dimension by which planar patterns transferred from a resist as a mask layer to a material layer of a microlens array are larger than planar patterns of the resist. Accordingly, a solid-state image pickup device with a high sensitivity and little smear can be manufactured.

In a method of manufacturing a solid-state image pickup device according to another aspect of the invention, the volume mixing ratio of oxygen to $CF_4$ in a gas mixture as an etching gas is set at 1:1 to 10. This produces a positive critical dimension by which planar patterns transferred from a resist as a mask layer to a material layer of a microlens array are larger than planar patterns of the resist. Accordingly, a solid-state image pickup device with a high sensitivity and little smear can be manufactured.

In a method of manufacturing a solid-state image pickup device according to another aspect of the invention, a gas mixture containing a larger amount of $CF_4$ than oxygen is used as an etching gas. This readily produces a positive critical dimension by which planar patterns transferred from a resist as a mask layer to a material layer of a microlens array are larger than planar patterns of the resist. Accordingly, a solid-state image pickup device with a high sensitivity and little smear can be easily manufactured.

In a method of manufacturing a solid-state image pickup device according to another aspect of the invention, a radio frequency power generated by a magnetron RIE system is set at 1.0 to 8.0 $W/cm^2$. This produces a positive critical dimension by which planar patterns transferred from a resist as a mask layer to a material layer of a microlens array are larger than planar patterns of the resist. Accordingly, a solid-state image pickup device with a high sensitivity and little smear can be manufactured.

In a method of manufacturing a solid-state image pickup device according to another aspect of the invention, the internal pressure of an etching chamber in a magnetron RIE system is set at 1.3 to 13.3 Pa. This produces a positive critical dimension by which planar patterns transferred from a resist as a mask layer to a material layer of a microlens array are larger than planar patterns of the resist. Accordingly, a solid-state image pickup device with a high sensitivity and little smear can be manufactured.

BRIEF DESCRIPTION OF THE DRAWINGS

FIGS. 3A and 3B are side sectional views of a CCD solid-state image pickup device according to the second related art of the present invention, in each of which the left half and the right half show portions taken along lines A—A and B—B, respectively, in FIG. 4, in which FIG. 3A shows a case where the diameter of a condenser microlens is relatively small and FIG. 3B shows a case where the diameter of the condenser microlens is relatively large;

DETAILED DESCRIPTION OF THE PREFERRED EMBODIMENTS

Figure 1A:
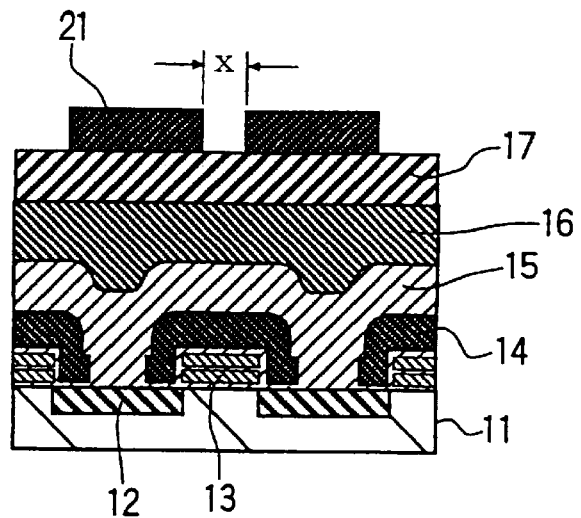
FIGS. 1A to 1C are side sectional views showing a method of manufacturing a CCD solid-state image pickup device having a microlens array in order of steps.
Figure 1B:
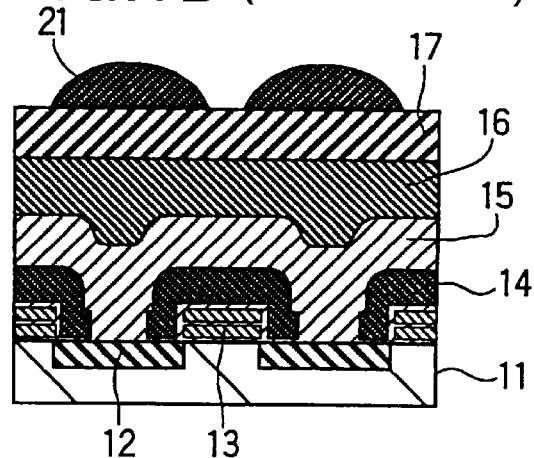
Figure 1C:
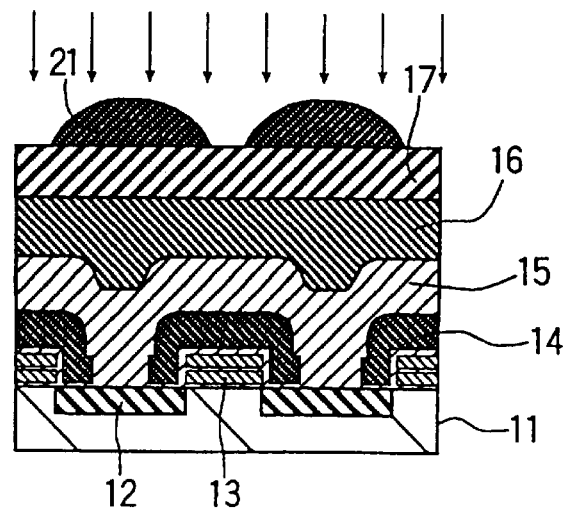
Figure 5:
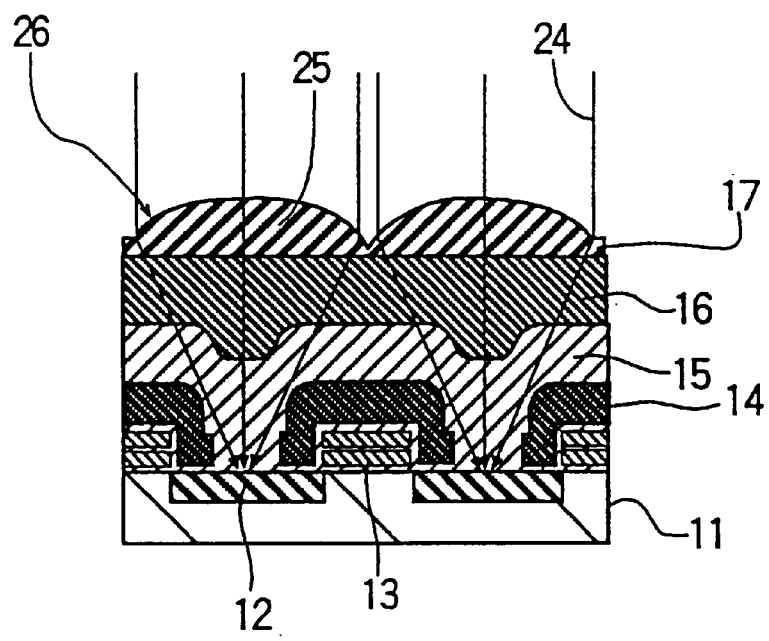
FIG. 5 is a side sectional view of a CCD solid-state image pickup device according to the first embodiment of the present invention.

The first and second embodiments of the present invention applied to a CCD solid-state image pickup device and a method of manufacturing the same will be described below with reference to FIGS. 5 to 8. FIG. 5 shows the first embodiment. A manufacturing method of this first embodiment is substantially the same as the manufacturing method of the first related art described earlier until the step shown in FIG. 1B and is also the same as the first related art in that a resist 21 and a material layer 17 are simultaneously etched as shown in FIG. 1C.

The first embodiment, however, differs from the first related art in the etching conditions. That is, the first embodiment uses a magnetron etching RIE system for generating a radio frequency power of 1.0 to 8.0 $W/cm^2$ for etching. Also, a gas mixture of oxygen and $CF_4$ mixed at a volume mixing ratio of 1:1 to 10 or $CF_4$ alone is supplied as an etching gas at a flow rate of 10 to 100 ccm, and the internal pressure of an etching chamber is set at 1.3 to 13.3 Pa.

When etching is performed under the above conditions, the plasma density is high and a large amount of deposition product is formed in the magnetron RIE system. Consequently, the etching of the resist 21 and the material layer 17 and the deposition of the product progress at the same time. However, while the deposition uniformly progresses on the entire surface, the etching rate is high near the tops of the resist 21 and the material layer 17 because the ion assist effect is notable in these regions and is low near the trenches because the ion assist effect is insignificant in these regions.

As a consequence, a positive critical dimension or CD gain by which planar patterns transferred from the resist 21 to the material layer 17 become larger than planar patterns of the resist 21 is produced. The amount of this CD gain can be controlled within the range of 0.1 to 1.0 µm by properly selecting the volume mixing ratio of oxygen and $CF_4$ as an etching gas.

In the first embodiment as described above, even when a spacing of about 0.3 µm is present between the planar patterns of the resist 21 as shown in FIG. 1C, a microlens array 26 in which almost no non-focusing region exists between microlenses 25 as shown in FIG. 5 can be formed.

Figure 2:
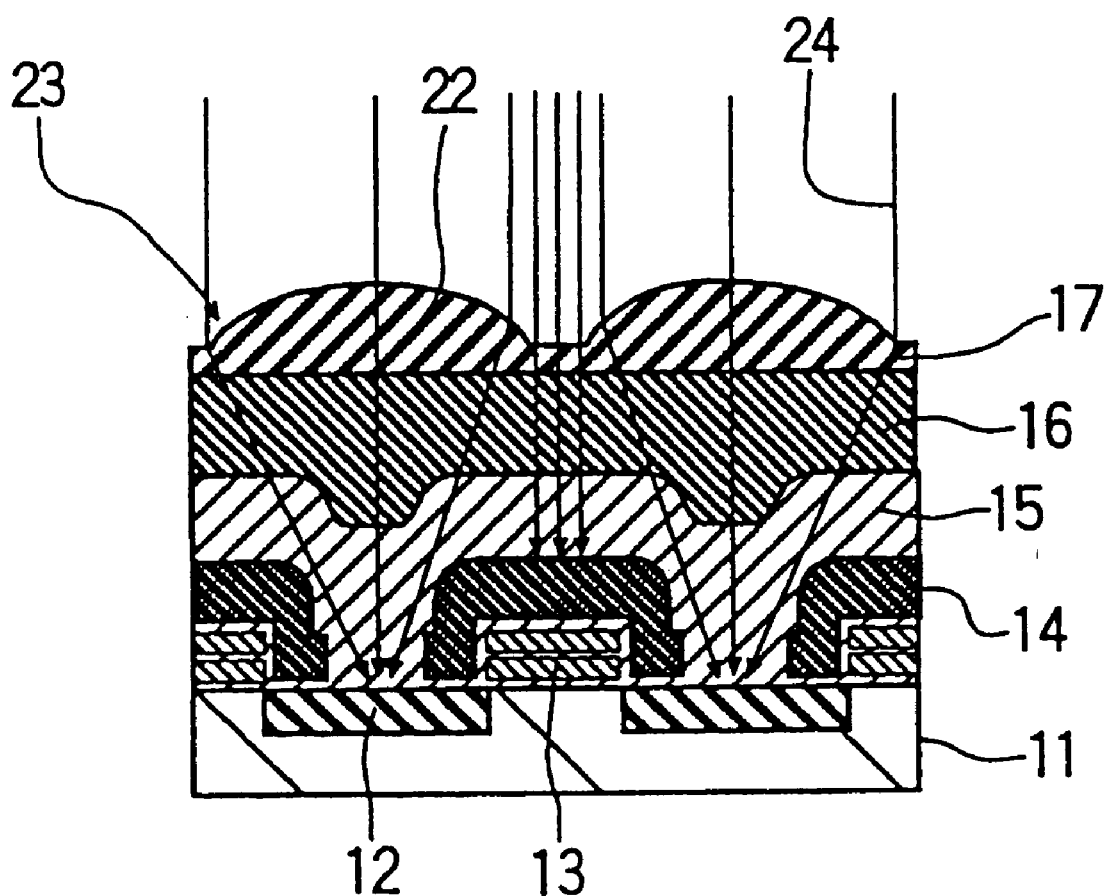
FIG. 2 is a side sectional view of a CCD solid-state image pickup device according to the first related art of the present invention.

In the microlens array 26 having almost no non-focusing region, as can be seen from FIG. 5, not only incident light 24 is effectively focused on photosensitive portions 12 but also the amount of the incident light 24 which obliquely is incident on the photosensitive portions 12 by being reflected by light-shielding films 14 or the like and enters into portions below charge transfer electrodes is small. For these reasons, the CCD solid-state image pickup device in FIG. 5 according to the first embodiment has a sensitivity higher by 20-odd % and has less smear than the CCD solid-state image pickup device in FIG. 2 according to the first related art.

In the above first embodiment, a magnetron RIE system is used to etch the resist 21 and the material layer 17. However, it is also possible to use a parallel plate RIE system, a high-pressure, narrow-gap plasma etching system, an ECR etching system, a microwave plasma etching system, or other high-density plasma etching systems such as a transformer coupled plasma etching system, an inductively coupled plasma etching system and a helicon wave plasma etching system.

Also, in the above first embodiment, an etching gas containing $CF_4$ is used to etch the resist 21 and the material layer 17. However, it is possible to use, instead of $CF_4$, flon gases such as $C_2F_6$, $C_3F_8$, $C_4F_8$, $CHF_3$ and $CH_2F_2$, halogen gases such as $Cl_2$, HCl, HBr and $BCl_3$, and nitrogen and oxide gases such as $N_2$, CO and $CO_2$.

Figure 3A:
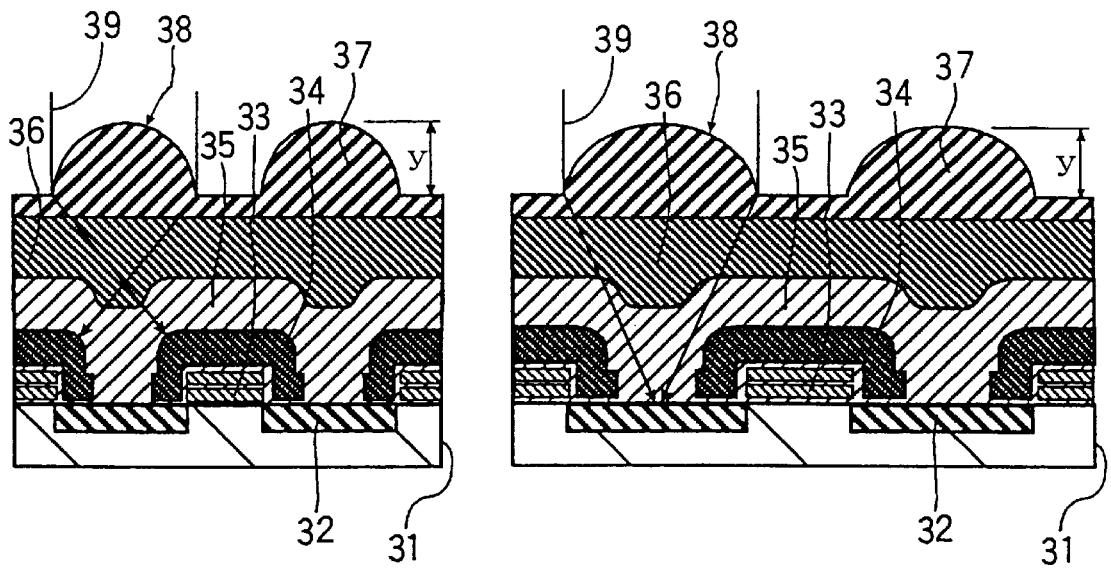
Figure 3B:
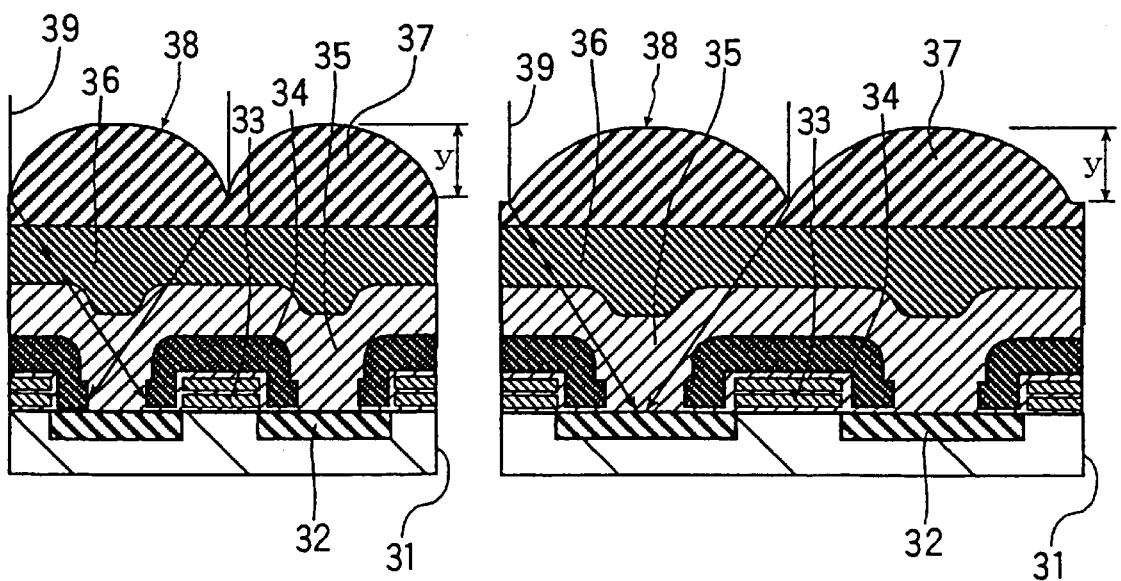
Figure 4:
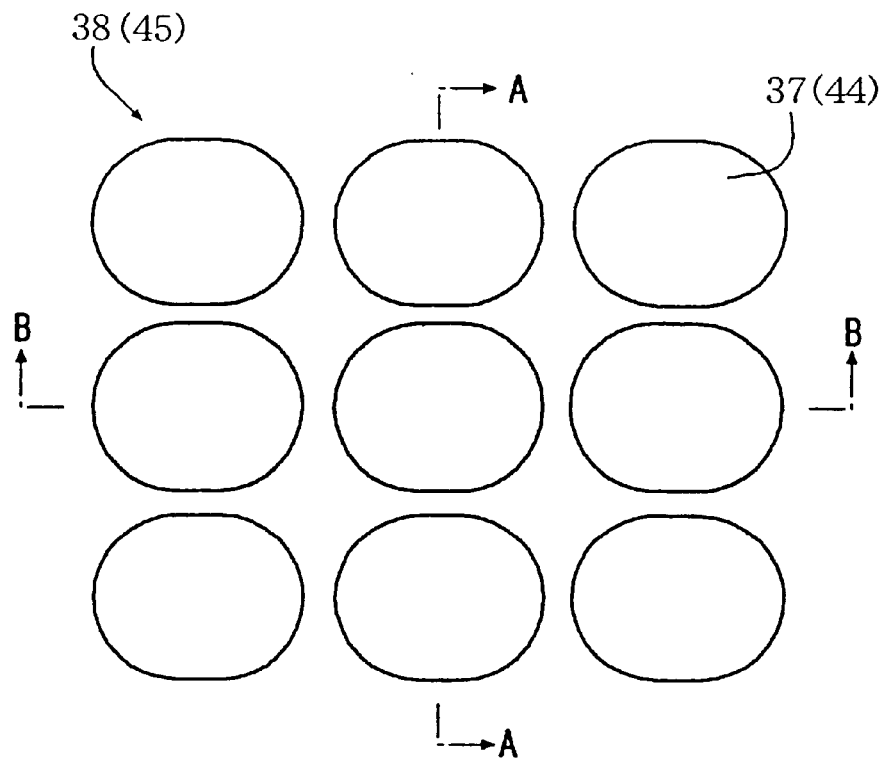
FIG. 4 is a plan view of a condenser microlens array in a CCD solid-state image pickup device to which the present invention is applicable.
Figure 6:
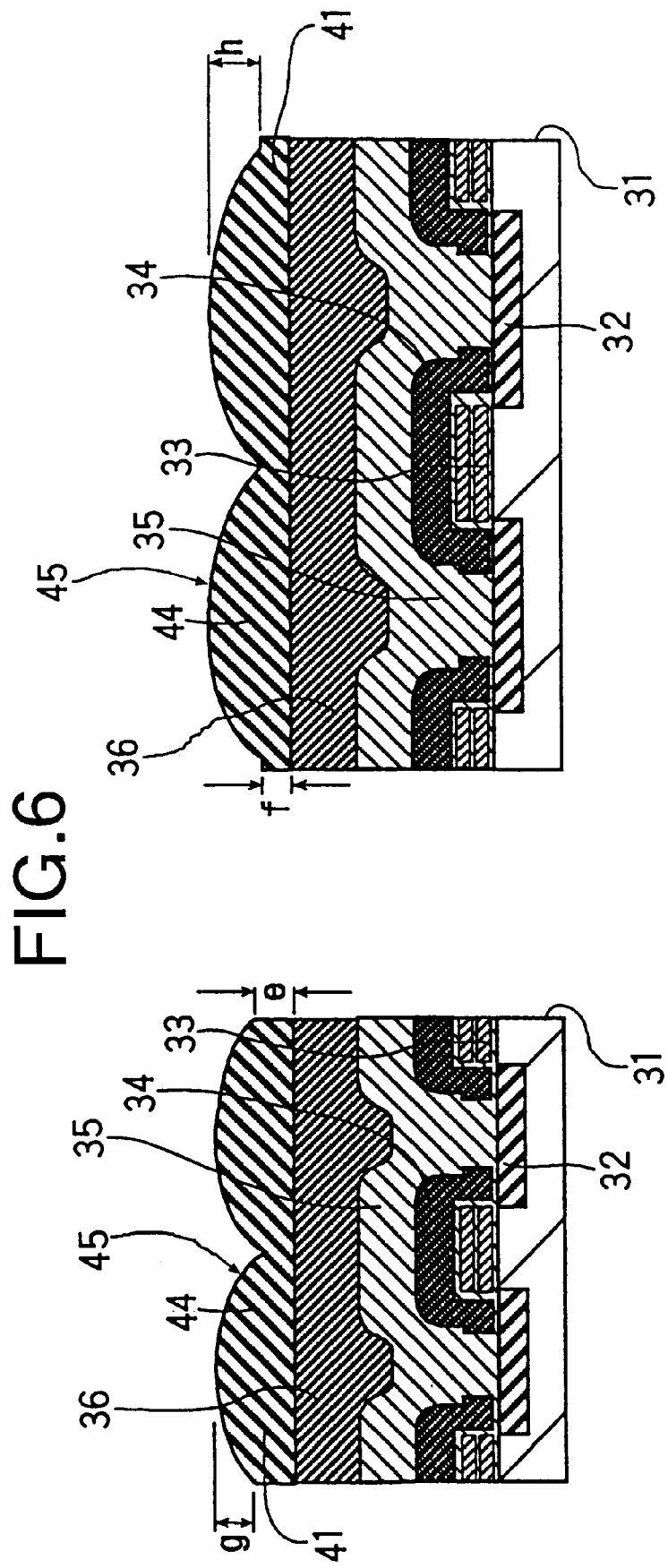
FIG. 6 is a side sectional view of a CCD solid-state image pickup device according to the second embodiment of the present invention, in which the left half and the right half show portions taken along the lines A—A and B—B, respectively, in FIG. 4.
Figure 7A:
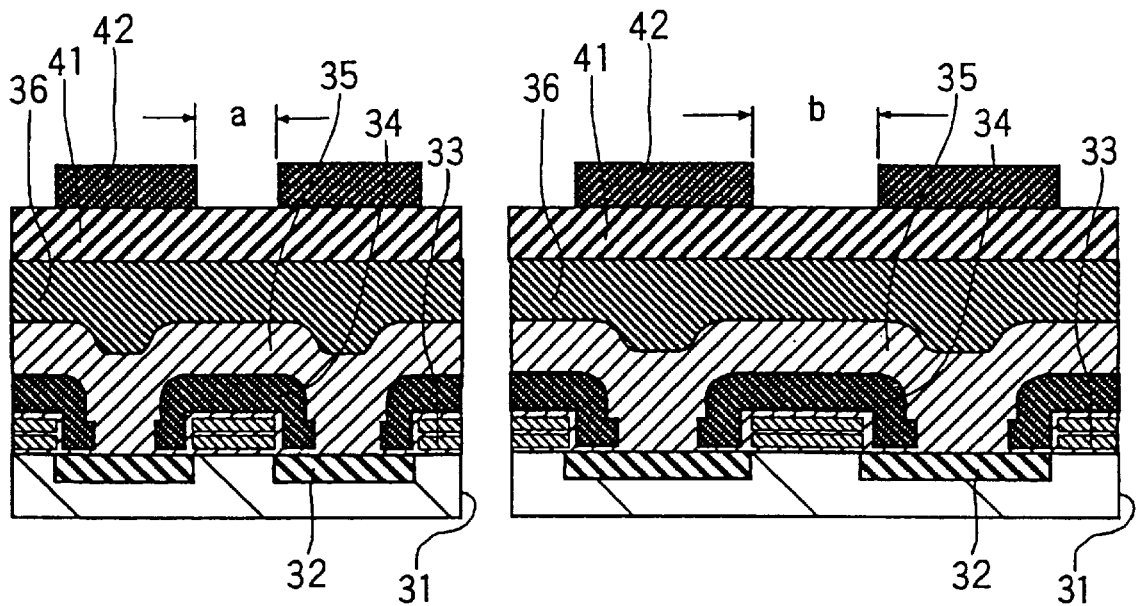
FIGS. 7A and 7B are side sectional views showing the first half of a manufacturing method according to the second embodiment in order of steps.

FIGS. 6 to 8 show the second embodiment. In a manufacturing method of this second embodiment, steps substantially the same as in the manufacture of the second related art shown in FIG. 3 are executed until a material layer 41 of a microlens array is formed on a color filter 36 by using a polystyrene resin, a polyimide resin or the like as shown in FIG. 7A.

Thereafter, a resist 42 is processed into matrix patterns for forming condenser microlenses on the color filter 36. In this processing, a spacing a between the resists 42 is made relatively narrow in a direction in which the height of the microlenses is to be decreased and a spacing b between the resists 42 is made relatively wide in a direction in which the height of the microlenses is to be increased.

Figure 7B:
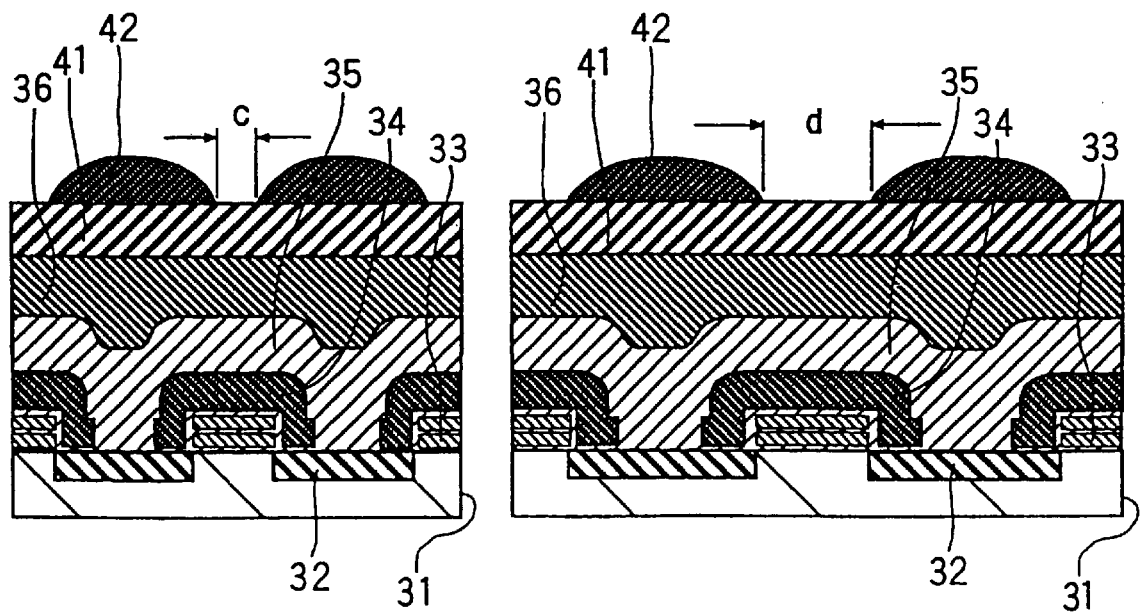

Subsequently, as shown in FIG. 7B, the resists 42 are deformed into the form of a dome by reflow. Even after this deformation, a spacing c between the resists 42 in the direction in which the height of the microlenses is to be decreased is relatively narrow, and a spacing d between the resists 42 in the direction in which the height of the microlenses is to be increased is relatively wide.

Figure 8A:
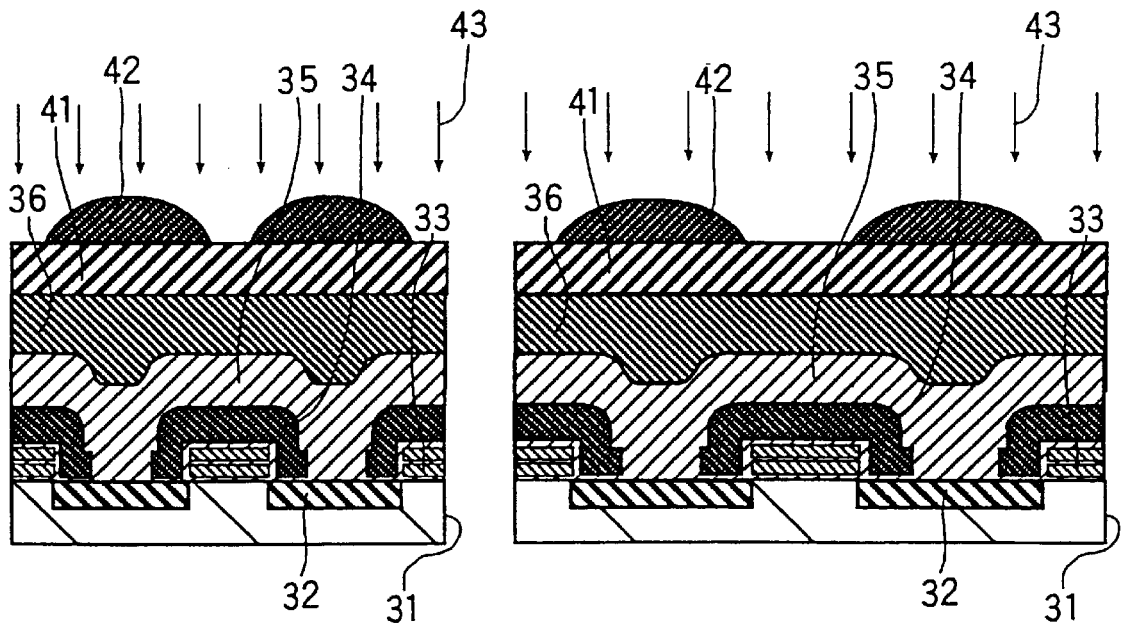
FIGS. 8A and 8B are side sectional views showing the second half of the manufacturing method according to the second embodiment in order of steps.

As shown in FIG. 8A, by using a magnetron RIE system for generating a radio frequency power of 1.0 to 8.0 W/cm$^2$, the resists 42 and the material layer 41 are simultaneously etched under a condition by which the etching selectivity of the resists 42 and the material layer 41 is close to 1, while an etching gas 43 which is a gas mixture of oxygen and $CF_4$ mixed at a volume mixing ratio of 1:1 to 10 or $CF_4$ alone is supplied at a flow rate of 10 to 100 ccm and the internal pressure of an etching chamber is set at 1.3 to 13.3 Pa. During the etching, $CF_4$ sequentially dissociates as follows.

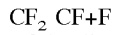

Of the dissociation products of the etching gas 43, O and F are etching species, and CF and $CF_2$ are deposition species. Etching and deposition are competitively advanced by these species.

A portion near the base of the dome-like resist 42 is nearly vertical. Therefore, this portion is not easily sputtered by O$^+$ ion, so a deposit originally readily adheres to this portion. Additionally, a magnetron RIE system uses a magnetic field, so electrons violently move. It is therefore considered that the plasma dissociation efficiency is high and the production amounts of CF and $CF_2$ as deposition species are large.

Figure 8B:
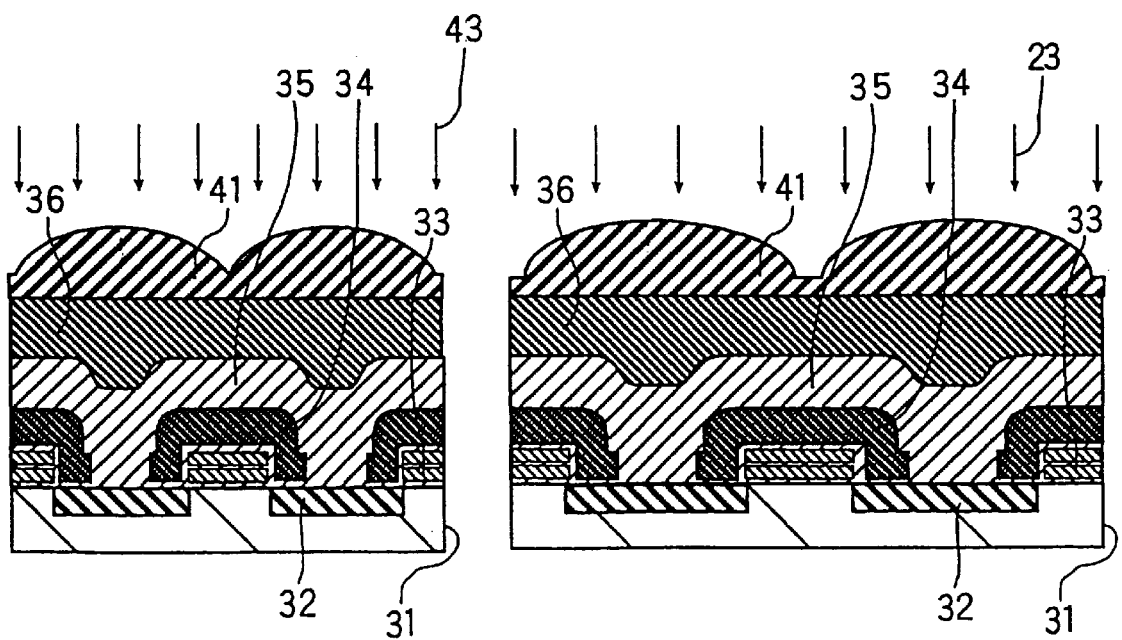

As a consequence, deposition is superior to etching in a portion near the base of the dome-like resist 42. This produces a positive critical dimension by which patterns are gradually enlarged as the dome-like shapes are transferred from the resists 42 to the material layer 41 by etching. As shown in FIG. 8B, therefore, although a flat portion is eliminated from the material layer 41 in the direction in which the dome-like resists 42 are arranged at the narrow spacing c, a flat portion remains in the material layer 41 in the direction in which the resists 42 are arranged at the wide spacing d.

Etching by the magnetron RIE system is further continued from the state shown in FIG. 8B to form a microlens array 45, in which microlenses 44 are arranged in a matrix manner, from the material layer 41 as shown in FIG. 6. During the formation, dome-like portions of the material layer 41 start contacting each other to bury trenches between the microlenses 44 earlier in the direction in which the dome-like resists 42 are arranged at the narrow spacing c.

Consequently, a height e from the surface of the color filter 36 to the base of the microlens 44 in the direction in which the dome-like resists 42 are arranged at the narrow spacing c is larger than a height f in the direction in which the resists 42 are arranged at the spacing d. That is, a height g of the microlenses 44 in the direction in which the dome-like resists 42 are arranged at the narrow spacing c is smaller than a height h in the direction in which the resists 42 are arranged at the wide spacing d.

Accordingly, the curvatures can be optimized by adjusting the heights g and h of the microlenses 44 in the row and column directions by adjusting the spacings c and d between the dome-like resists 42. Consequently, although the planar shape of the microlens 44 is an ellipse, the focal points of incident light can be positioned in the photosensitive portion 32 in both the row and column directions. Additionally, since the microlens 44 has no interface inside it and rarely reflects incident light, the CCD solid-state image pickup device of this second embodiment has a high sensitivity and little smear.

The above second embodiment uses the etching gas 43 which is a gas mixture of oxygen and $CF_4$ mixed at a volume mixing ratio of 1:1 to 10 or $CF_4$ alone. However, when the etching gas 43 in which the ratio of $CF_4$ is high, e.g., a gas mixture of oxygen and $CF_4$ mixed at a volume mixing ratio of 1:10 or $CF_4$ alone is used, the microlenses 44 having the different heights g and h in the row and column directions can be easily formed.

Also, in the second embodiment, etching is continued until the microlenses 44 contact each other in both the row and column directions as shown in FIG. 6. However, when the microlenses 44 start contacting each other in one direction, the heights of the microlenses 44 in the row and column directions become different from each other. Therefore, etching can be stopped at that timing although the microlenses 44 have not started contacting each other in the other direction.

Furthermore, the second embodiment uses a magnetron RIE system and the etching gas 43 which is a gas mixture of oxygen and $CF_4$ mixed at a volume mixing ratio of 1:1 to 10 or $CF_4$ alone. However, another etching system or etching gas can also be used as long as it is possible to obtain conditions which produce a positive critical dimension by which patterns are gradually enlarged as the dome-like shapes are transferred from the resists 42 to the material layer 41 by etching.

Moreover, in the first and second embodiments described above the present invention is applied to a CCD solid-state image pickup device and a method of manufacturing the same. However, the present invention is also applicable to the manufacture of another solid-state image pickup device such as a MOS solid-state image pickup device for performing amplification or a liquid crystal display device, provided that a microlens array is formed in an on-chip state.

What is claimed is:

1. A method of forming a microlens array, comprising the steps of:

forming a mask layer having dome-like three-dimensional shapes of microlenses of a microlens array on a material layer of said microlens array; and simultaneously etching said mask layer and said material layer under a condition by which planar patterns transferred from said mask layer to said material layer are larger than planar patterns of said mask layers, until said microlenses start contacting each other in a direction in which the spacing is narrow.

2. A method of forming a microlens array, comprising the steps of:

forming a mask layer having a three-dimensional shapes of a microlens array on a material layer of said microlens array; and simultaneously etching said mask layer and said material layer under a condition by which planar patterns transferred from said mask layer to said material layer are larger than planar patterns of said mask layers, wherein, said mask layer has dome-like portions arranged in a matrix manner at different spacings in row and column directions, and the etching is performed until said microlenses start contacting each other in a direction in which the spacing is narrow.

3. A method of forming a microlens array, comprising the steps of:

forming a mask layer having a three-dimensional shapes of a microlens array on a material layer of said microlens array; and simultaneously etching said mask layer and said material layer under a condition by which planar patterns transferred from said mask layer to said material layer are larger than planar patterns of said mask layers, wherein, a resist is used as said mask layer, a gas mixture of oxygen and $CF_4$ or $CF_4$ is used as an etching gas, and the etching is performed by using a magnetron RIE system.

4. A method according to claim 3, wherein a flow rate of said etching gas is 10 to 100 ccm.

5. A method according to claim 3, wherein a volume mixing ratio of oxygen to $CF_4$ in said gas mixture is 1:1 to 10.

6. A method according to claim 3, wherein a radio frequency power generated by said magnetron RIE system is 1.0 to 8.0 W/cm$^2$.

7. A method according to claim 3, wherein an internal pressure of an etching chamber of said magnetron RIE system is 1.3 to 13.3 Pa.

8. A method according to claim 2, wherein a planar shape of said mask layer is an ellipse.

9. A method according to claim 2, wherein said microlens array is formed to oppose a plurality of photosensitive portions of a solid-state image pickup device.

10. A method according to claim 2, wherein said microlens array is formed to oppose a plurality of display portions of a liquid crystal display device.

11. A method of manufacturing a solid-state image pickup device having a microlens array in which a plurality of condenser microlenses are arranged in a matrix manner in a one-to-one correspondence with a plurality of photosensitive portions arranged in a matrix manner, comprising the steps of:

forming a mask layer having a three-dimensional shape of said microlens array on a material layer of said microlens array; and simultaneously etching said mask layer and said material layer under a condition by which planar patterns transferred from said mask layer to said material layer are larger than planar patterns of said mask layer, wherein, said mask layer has dome-like portions arranged in a matrix manner at different spacings in row and column directions, and the etching is performed until said microlenses start contacting each other in a direction in which the spacing is narrow.

12. A method of manufacturing a solid-state image pickup device having condenser microlenses in a one-to-one correspondence with a plurality of photosensitive portions arranged in a matrix manner, comprising the steps of:

forming a mask layer having dome-like portions arranged at different spacings in row and column directions on a material layer of said microlenses above said photosensitive portions; and simultaneously etching said mask layer and said material layer under a condition by which planar patterns transferred from said mask layer to said material layer are larger than planar patterns of said mask layer, until said microlenses start contacting each other in a direction in which the spacing is narrow.

13. A method according to claim 12, wherein a planar shape of said mask layer is an ellipse.

14. A method according to claim 12, wherein a resist is used as said mask layer, a gas mixture of oxygen and $CF_4$ or $CF_4$ is used as an etching gas, and the etching is performed by using a magnetron RIE system.

15. A method according to claim 14, wherein a flow rate of said etching gas is 10 to 100 ccm.

16. A method according to claim 14, wherein a volume mixing ratio of oxygen to $CF_4$ in said gas mixture is 1:1 to 10.

17. A method according to claim 14, wherein said gas mixture contains a larger amount of $CF_4$ than oxygen.

18. A method according to claim 14, wherein a radio frequency power generated by said magnetron RIE system is 1.0 to 8.0 W/cm$^2$.

19. A method according to claim 14, wherein an internal pressure of an etching chamber of said magnetron RIE system is 1.3 to 13.3 Pa.

* * * * *